United States Patent [19]
DiPiazza

[11] 4,039,838
[45] Aug. 2, 1977

[54] HIGH RESOLUTION FLUORESCENT SCREEN AND METHODS OF MAKING AND USING THE SAME

[75] Inventor: James John DiPiazza, Burlington County, N.J.

[73] Assignee: RCA Corporation, New York, N.Y.

[21] Appl. No.: 664,877

[22] Filed: Mar. 8, 1976

[51] Int. Cl.² .......................... G01J 1/58; G01N 21/38
[52] U.S. Cl. ..................................... 250/483; 250/487; 250/461 R
[58] Field of Search ............... 250/458, 459, 461, 482, 250/483, 487, 329; 350/311

[56] References Cited
U.S. PATENT DOCUMENTS 3,549,886 12/1970 Hilborn ................................ 250/459
3,617,744 11/1971 Irish ..................................... 250/461

Primary Examiner—Archie R. Borchelt
Attorney, Agent, or Firm—H. Christoffersen; R. P. Williams; Sanford J. Asman

[57] ABSTRACT

A high resolution fluorescent screen including an amorphous coating of fluorescent dye on a substrate transparent to visible light is used to enable an observer to examine photomasks of the type used in manufacturing integrated circuits by using ultraviolet light. The screen converts ultraviolet light passing through the photomask into visible light. The screen is comprised of a transparent substrate having a high resolution amorphous coating of fluorescent dye in a binder on one side. Alternatively, a transparent substrate including a fluorescent material, such as uranium glass, may be used. On the other side of the substrate an ultraviolet blocking filter is applied to prevent ultraviolet light from injuring the eye of an observer using the screen.

10 Claims, 1 Drawing Figure

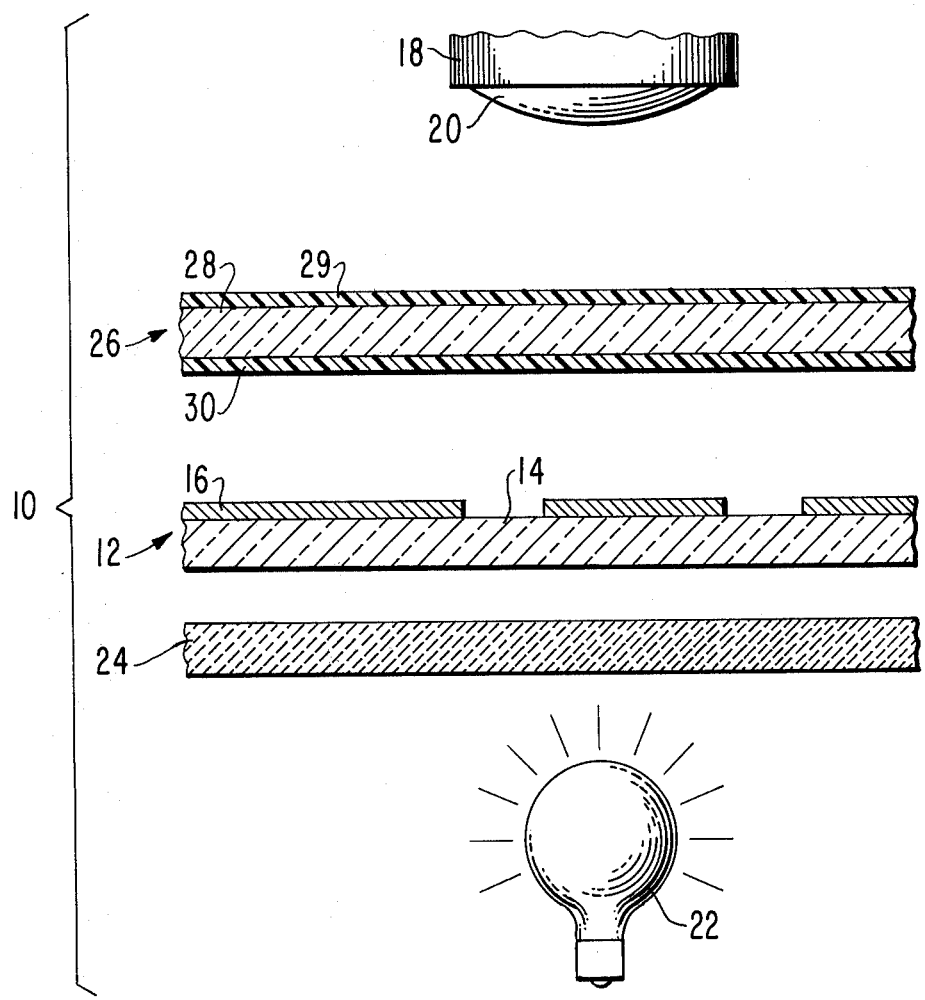

HIGH RESOLUTION FLUORESCENT SCREEN AND METHODS OF MAKING AND USING THE SAME

The present invention relates to high resolution fluorescent screens and to the use of such screens for visually examining photomasks employing radiation having the same spectrum as that used to expose photoresist material.

Presently, workers in the field of mask processing and users of photomasks, especially those used for the manufacture of integrated circuit devices, examine the photomasks for defects by utilizing optical methods which are restricted to the visible portion of the electromagnetic spectrum. Use of the ultraviolet portion of the spectrum, to which most photoresist materials are sensitive, is restricted to nonvisual examination and is not generally used because of the limited amount of information obtained by such examinations and the expensive nature of the equipment required.

The majority of photoresists used in photolithograph processes are reactive to a range of wavelengths shorter than those in the visible region of the spectrum. As a result, examination of photomasks using visible light presents only a partial picture of the effect which a photomask has on a photoresist, because visible light does not permit a worker to "see" what the photoresist "sees".

It would, therefore, be desirable to view the photomasks under ultraviolet light. However, it has not heretofore been possible to do so, because the eye is not sensitive to ultraviolet light. Also, the extremely fine lines on photomasks requires that a high resolution optical system be employed. The high resolution required is not present in conventional inorganic fluorescent dyes, which prohibits their use in a fluorescent screen having the desired optical qualities.

The sole drawing is a cross-sectional view of the screen of the present invention and a system employing the screen.

Referring generally to the drawing, the use of the present invention will be described with reference to the system 10 shown therein. In particular, a photomask 12 is generally comprised of a transparent support 14 having an opaque pattern matrix 16 thereon. Such photomasks 12 are generally examined by an observer, through a microscope 18 (not fully shown) having an objective lens 20.

In the present invention, an ultraviolet light source 22 of the type used to expose photoresist material through the mask 12 is placed under the mask 12, with the mask 12 interposed between the light 22 and the objective lens 20 of the microscope 18. A filter 24 is optionally placed between the light 22 and the mask 12, and, if used, the filter 24 is of a type which transmits ultraviolet light in the spectrum to which the photoresist material intended to be used with the mask 12 is sensitive, as will be more fully explained hereinafter.

In order to allow the observer to view any flaws in the mask 12 of the type which pass ultraviolet light, but not necessarily visible light, a screen 26 comprising a substrate 28 which is transparent to visible light and which has a fluorescent coating 30 on the side proximate the mask 12, is interposed between the objective lens 20 and the mask 12. The screen 26 is further comprised of an ultraviolet blocking filter 29 which transmits visible light but which is opaque to ultraviolet light of the type generated by the light 22. Accordingly, ultraviolet light from the source 22 which passes through the mask 12 and reaches the fluorescent coating 30 generates visible light which passes through the support layer 28 and the filter 29.

In view of the fine detail employed in the photomasks of the type used in the manufacture of integrated circuits, the screen 26 must be constructed to be very fine grained or to be grainless in order to provide very high resolution. An organic fluorescent dye capable of producing an amorphous film in a binder is used to provide the high resolution fluorescent coating 30. The dye chosen must be soluble in a binder capable of forming a film, and the binder chosen must be transparent to ultraviolet light. TINOPAL SFG, manufactured by CIBA-GEIGY of Ardsley, New York, is a suitable dye and VITON, a fluoroelastomer, manufactured by E. I. DuPont de Nemours & Co., Inc. of Wilmington, Delaware is a suitable binder. The dye and binder are both soluble in acetone.

In order to manufacture the screen 26 one starts with a substrate 28 transparent to visible light, such as a glass. The substrate 28 may have an iron oxide ultraviolet blocking filter 29 sputtered thereon. The iron oxide coating 29 passes visible light while blocking ultraviolet light. A solution comprising dye, binder, and a solvent, such as acetone, in a suitable ratio such as 1 part dye to 50 parts binder to 500 parts solvent is made up and is applied to the side of the glass substrate 28 which is not coated with the iron oxide. The substrate 28 is placed on a turntable and spun at approximately 2000 rpm for approximately 15 seconds. In that time, the acetone will evaporate leaving an amorphous coating 30 of fluorescent dye in the binder having a thickness of approximately 3000A.

Following the completion of the screen 26, photomasks may be examined by using the screen 26 as heretofore described with reference to the drawing. An optional optical bandpass filter 24 having a passband corresponding to the frequencies of sensitivity of a particular photoresist may be employed to permit an observer examining a mask 12 to determine how a particular photoresist will react when used with the mask 12.

While a method of making an appropriate screen 26 has been described, it is possible also to employ a substrate material which will fluoresce when exposed to ultraviolet light without departing from the present invention. One such material is called uranium glass. In the event that material such as uranium glass is used for the substrate of the screen 26, it is not necessary to employ an additional fluorescent coating thereon. However, the ultraviolet blocking filter 29 will still be utilized.

What I claim is:
1. A high resolution fluorescent screen for testing photomasks comprising:
 a. a substrate having two sides, said substrate being transparent to visible light;
 b. means comprising an organic dye in a binder applied to one surface of said substrate, said means emitting visible light when exposed to ultraviolet light; and
 c. a filter on one side of said substrate for blocking ultraviolet light which has passed through said photomask while passing visible light, whereby visible light is emitted by said screen in locations corresponding to locations where ultraviolet light has passed through said photomask.

2. A high resolution fluorescent screen for testing photomasks comprising:
   a. a substrate having two sides, said substrate being transparent to visible light,
   b. means associated with said substrate for emitting visible light when said means is exposed to ultraviolet light; and
   c. a filter comprised of an iron oxide coating on one side of said substrate for blocking ultraviolet light which has passed through said photomasks while passing visible light, whereby visible light is emitted by said screen in locations corresponding to locations where ultraviolet light has passed through said photomask.

3. A high resolution fluorescent screen for testing photomasks comprising:
   a. a substrate made of uranium glass having two sides, said substrate being transparent to visible light and emitting visible light when exposed to ultraviolet light; and
   b. a filter on one side of said substrate for blocking ultraviolet light which has passed through said photomask while passing visible light, whereby visible light is emitted by said screen in locations corresponding to locations where ultraviolet light has passed through said photomask.

4. The screen of claim 1 in which said means is applied as an amorphous layer.

5. The method of making a high resolution fluorescent screen comprising the steps of:
   a. providing a transparent substrate with a fluorescent material uniformly distributed thereover; and
   b. coating one side of said transparent substrate with a material which is transparent to visible light but which blocks ultraviolet light.

6. The method of claim 5 in which said step of providing is accomplished by applying an amorphous layer of fluorescent material over the other side of said substrate.

7. The method of claim 6 in which said step of coating is accomplished by sputtering.

8. The method of claim 6 in which said step of applying is acomplished by spin coating a solution of fluorescent dye onto said substrate.

9. The method of claim 8 further comprising the preparation of said solution by dissolving an organic dye and a binder in a solvent.

10. The method of claim 5 in which said step of providing is accomplished by choosing a substrate made of fluorescent transparent material.

* * * * *